United States Patent
Velez et al.

(10) Patent No.: US 10,498,307 B2
(45) Date of Patent: Dec. 3, 2019

(54) INTEGRATED DEVICE COMPRISING A CAPACITOR AND INDUCTOR STRUCTURE COMPRISING A SHARED INTERCONNECT FOR A CAPACITOR AND AN INDUCTOR

(71) Applicant: QUALCOMM Incorporated, San Diego, CA (US)

(72) Inventors: Mario Francisco Velez, San Diego, CA (US); Niranjan Sunil Mudakatte, San Diego, CA (US); Jonghae Kim, San Diego, CA (US); Changhan Hobie Yun, San Diego, CA (US); David Francis Berdy, San Diego, CA (US); Shiqun Gu, San Diego, CA (US); Chengjie Zuo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 69 days.

(21) Appl. No.: 15/705,035

(22) Filed: Sep. 14, 2017

(65) Prior Publication Data

US 2019/0081607 A1  Mar. 14, 2019

(51) Int. Cl.
| | |
|---|---|
| *H03H 7/01* | (2006.01) |
| *H01L 49/02* | (2006.01) |
| *H01L 23/532* | (2006.01) |
| *H03H 3/00* | (2006.01) |
| *H01L 27/01* | (2006.01) |

(Continued)

(52) U.S. Cl.
CPC ....... *H03H 7/0115* (2013.01); *H01L 23/5223* (2013.01); *H01L 23/5227* (2013.01); *H01L 23/5283* (2013.01); *H01L 23/53257* (2013.01); *H01L 27/016* (2013.01); *H01L 28/10* (2013.01); *H01L 28/60* (2013.01); *H03H 3/00* (2013.01); *H01L 21/3212* (2013.01); *H01L 21/7684* (2013.01); *H01L 21/76802* (2013.01); *H01L 21/76843* (2013.01); *H01L 21/76871* (2013.01);

(Continued)

(58) Field of Classification Search
CPC ................ H03H 2001/0085; H03H 7/0115
USPC ................................. 333/175, 185
See application file for complete search history.

(56) References Cited

U.S. PATENT DOCUMENTS

| | | |
|---|---|---|
| 8,269,566 B2 | 9/2012 | Upadhyaya et al. |
| 9,247,647 B1 | 1/2016 | Yoon et al. |

(Continued)

FOREIGN PATENT DOCUMENTS

| | | |
|---|---|---|
| CN | 101587776 A | 11/2009 |
| TW | 586140 B | 5/2004 |

*Primary Examiner* — Rakesh B Patel
(74) *Attorney, Agent, or Firm* — Loza & Loza, LLP/Qualcomm

(57) ABSTRACT

An integrated device that includes a substrate, a first interconnect over the substrate and a second interconnect comprising a first portion and a second portion. The integrated device further comprising a first dielectric layer between the first interconnect and the first portion of the second interconnect such that the first interconnect vertically overlaps with the first dielectric layer and the first portion of the second interconnect. The integrated device also includes a second dielectric layer formed over the substrate. The first interconnect, the first dielectric layer and the first portion of the second interconnect are configured to operate as a capacitor. The first portion and the second portion of the second interconnect are configured to operate as an inductor.

24 Claims, 15 Drawing Sheets

(51) Int. Cl.
*H01L 23/522* (2006.01)
*H01L 23/528* (2006.01)
H01L 21/321 (2006.01)
H01L 21/768 (2006.01)
H03H 1/00 (2006.01)

(52) U.S. Cl.
CPC .............. *H01L 21/76877* (2013.01); *H03H 2001/0085* (2013.01)

(56) References Cited

U.S. PATENT DOCUMENTS

| | | | |
|---|---|---|---|
| 2013/0162372 A1* | 6/2013 | Sasaki | H01F 17/0013 333/185 |
| 2014/0145898 A1 | 5/2014 | Tokuda | |
| 2015/0015344 A1* | 1/2015 | Tai | H03H 7/427 333/185 |
| 2016/0126917 A1* | 5/2016 | Ahn | H03H 1/0007 333/185 |
| 2016/0307702 A1* | 10/2016 | Tanaka | H01G 4/40 |

* cited by examiner

PLAN VIEW

| | INDUCTOR (M2) |
|---|---|
| | CAPACITOR (M1, M2) |
| | INDUCTOR UNDERPASS (M1) |
| | M1 AND M2 INDUCTOR OVERLAP AREA |

US 10,498,307 B2

INTEGRATED DEVICE COMPRISING A CAPACITOR AND INDUCTOR STRUCTURE COMPRISING A SHARED INTERCONNECT FOR A CAPACITOR AND AN INDUCTOR

BACKGROUND

Field

Various features relate to integrated devices, but more specifically to integrated devices comprising a capacitor and inductor structure comprising a shared interconnect for a capacitor and an inductor.

Background

FIG. 1 illustrates an integrated passive device (IPD) 100 that includes a substrate 100, a first interconnect 120, a first dielectric layer 125, a second interconnect 130, a third interconnect 150 and a second dielectric layer 160. The first interconnect 120, the first dielectric layer 125, and the second interconnect 130 define a capacitor in the integrated passive device (IPD) 100. The integrated passive device (IPD) 100 also includes an inductor that is defined by the third interconnect 150. In FIG. 1, the capacitor and the inductor are formed in the second dielectric layer 160 of the integrated passive device (IPD) 200.

FIG. 2 illustrates an integrated passive device (IPD) 200 that includes the substrate 100, the first interconnect 120, the first dielectric layer 125, the second interconnect 130, the third interconnect 150, the second dielectric layer 160, a via 240 and a fourth interconnect 250. The first interconnect 120, the first dielectric layer 125, and the second interconnect 130 define a capacitor in the integrated passive device (IPD) 200. The integrated passive device (IPD) 200 also includes an inductor that is defined by the third interconnect 150, the via 240 and the fourth interconnect 250. In FIG. 2, the capacitor and the inductor are formed in the second dielectric layer 160 of the integrated passive device (IPD) 200.

As shown in FIG. 1 and FIG. 2, the capacitor and inductor take up a lot of space in their respective integrated passive devices (IPDs). Therefore, there is an ongoing need to reduce the size of integrated devices and packages, and to provide better performing integrated devices and packages.

SUMMARY

Various features relate to integrated devices, but more specifically to integrated devices comprising a capacitor and inductor structure comprising a shared interconnect for a capacitor and an inductor.

One example provides an integrated device that includes a substrate, a first interconnect over the substrate and a second interconnect comprising a first portion and a second portion. The integrated device further comprising a first dielectric layer between the first interconnect and the first portion of the second interconnect such that the first interconnect vertically overlaps with the first dielectric layer and the first portion of the second interconnect. The integrated device also includes a second dielectric layer formed over the substrate. The first interconnect, the first dielectric layer and the first portion of the second interconnect are configured to operate as a capacitor. The first portion and the second portion of the second interconnect are configured to operate as an inductor.

Another example provides an apparatus that includes a substrate, means for capacitance comprising a first interconnect, a first dielectric layer, and a first portion of a second interconnect, means for inductance comprising the first portion of the second interconnect and a second portion of the second interconnect, and a second dielectric layer formed over the substrate. The first dielectric layer is between the first interconnect and the first portion of the second interconnect such that the first interconnect vertically overlaps with the first dielectric layer and the first portion of the second interconnect.

Another example provides a method for fabricating an integrated device. The method provides a substrate. The method forms a first interconnect over the substrate. The method forms a second interconnect comprising a first portion and a second portion. The method provides a first dielectric layer between the first interconnect and the first portion of the second interconnect such that the first interconnect vertically overlaps with the first dielectric layer and the first portion of the second interconnect. The method provides a second dielectric layer over the substrate. The first interconnect, the first dielectric layer and the first portion of the second interconnect are configured to operate as a capacitor. The first portion and the second portion of the second interconnect are configured to operate as an inductor.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device that includes a substrate, a first interconnect over the substrate and a second interconnect comprising a first portion and a second portion. The integrated device further comprises a first dielectric layer between the first interconnect and the first portion of the second interconnect such that the first interconnect vertically overlaps with the first dielectric layer and the first portion of the second interconnect. The integrated device also includes a second dielectric layer formed over the substrate. The first interconnect, the first dielectric layer and the first portion of the second interconnect are configured to operate as a capacitor. The first portion and the second portion of the second interconnect are configured to operate as an inductor. In some implementations, the integrated device includes an adhesion layer between the first interconnect and the first dielectric layer. The integrated device may be configured to operate as a low pass filter.

Exemplary Integrated Device Comprising a Capacitor and Inductor Structure

Figure 1:
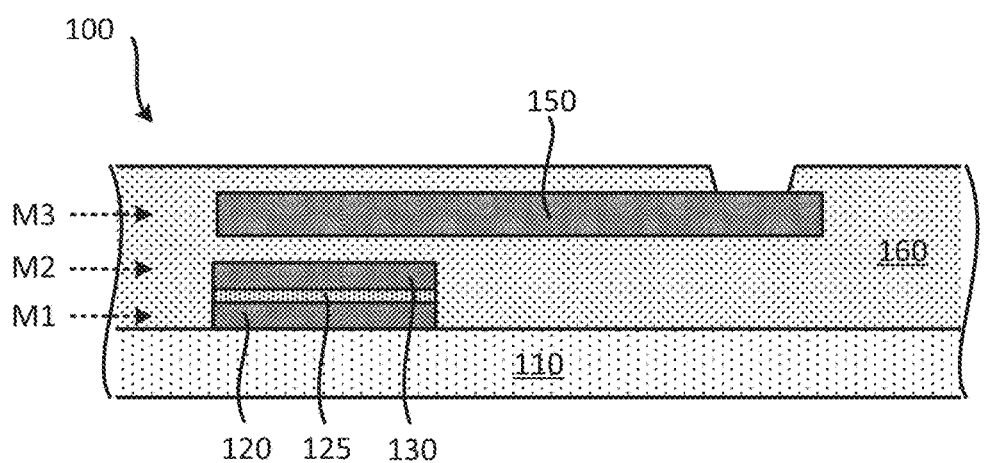
FIG. 1 illustrates a profile view of an integrated passive device (IPD) that includes a capacitor and an inductor.
Figure 2:
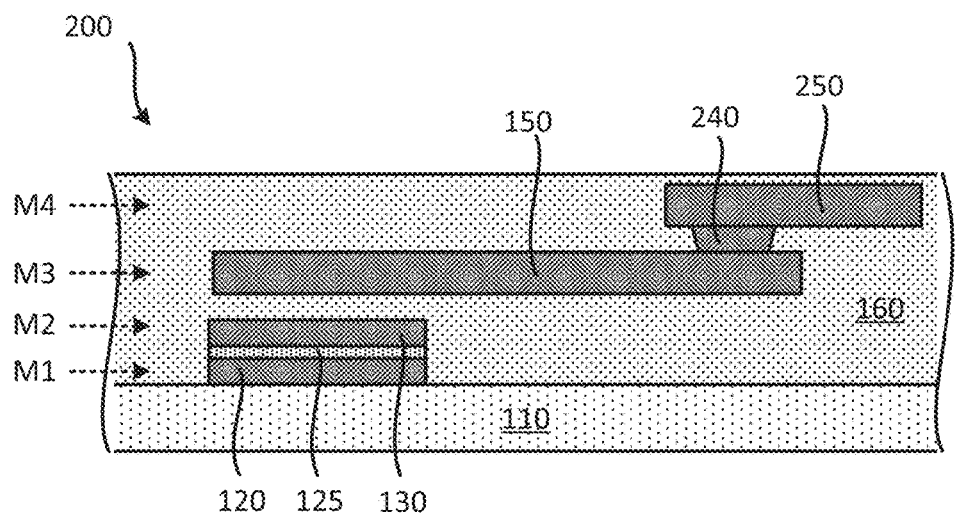
FIG. 2 illustrates a profile view of another integrated passive device (IPD) that includes a capacitor and an inductor.
Figure 3:
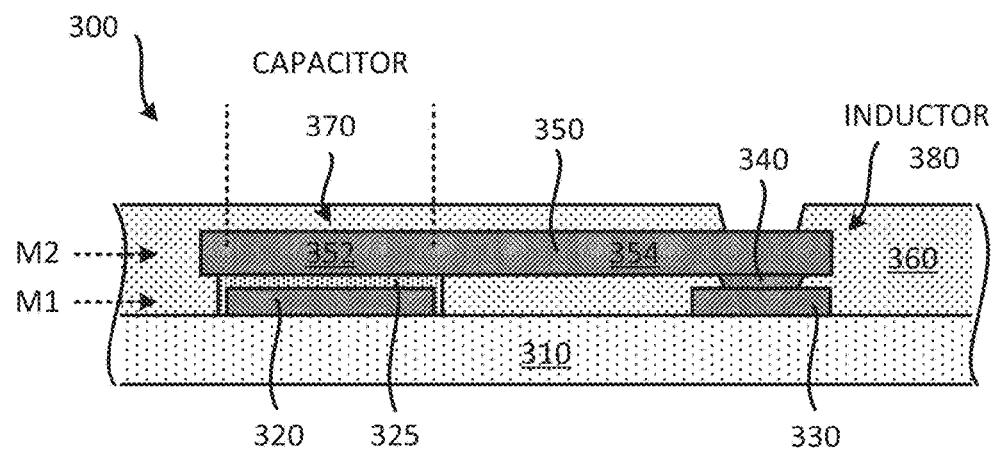
FIG. 3 illustrates a profile view of an integrated device that includes an inductor and a capacitor that share a portion of an interconnect.

FIG. 3 illustrates an integrated device 300 that includes a capacitor 370 and an inductor 380. In some implementations, the combination of the capacitor 370 and the inductor 380 may form a capacitor and inductor structure. The integrated device 300 includes a substrate 310, a first interconnect 320, a first dielectric layer 325, an interconnect 330, an interconnect 340, a second interconnect 350 and a second dielectric layer 360. The second interconnect 350 includes a first portion 352 and a second portion 354. The first interconnect 320 may be a first metal layer (M1) of the integrated device 300, and the second interconnect 350 may be a second metal layer (M2) of the integrated device 300. In some implementations, the integrated device 300 may be an integrated passive device (IPD). It is noted that the integrated device 300 may be part of a semiconductor die, an integrated package (e.g., integrated circuit (IC) package), a package substrate, an interposer and/or printed circuit board (PCB).

The capacitor 370 may be a means for capacitance. The capacitor 370 includes the first interconnect 320, the first dielectric layer 325 and the first portion 352 of the second interconnect 350. As such, the first interconnect 320, the first dielectric layer 325 and a portion of the second interconnect 350 may be configured to operate as the capacitor 370. The first dielectric layer 325 is located between the first interconnect 320 and the first portion 352 of the second interconnect 350. The first interconnect 320, the first dielectric layer 325 and the first portion of the second interconnect 350a at least partially vertically overlap with each other. The first dielectric layer 325 may also laterally surround the first interconnect 320. That is, the first dielectric layer 325 may be formed on the side portions of the first interconnect 320.

The inductor 380 may be a means for inductance. The inductor 380 may include the second interconnect 350. More, specifically, the inductor 380 may include the first portion 352 of the second interconnect 350 and the second portion 354 of the second interconnect 350. As such, the second interconnect 350 may be configured to operate as the inductor 380. As shown in FIG. 3, the inductor 380 shares a portion of the second interconnect 350 with the capacitor 370. In particular, the inductor 380 and the capacitor 370 share the first portion 352 of the second interconnect 350. As such, the first portion 352 of the second interconnect 350 is part of the capacitor 370 and the inductor 380. The inductor 380 may also include the interconnect 330 and the interconnect 340. The interconnect 340 may be a via. The interconnect 330 may be a trace or pad of the inductor 380. The interconnect 330 may form a terminal or winding of the inductor 380.

There are several technical advantages to the above configuration of the integrated device 300. First, the integrated device 300 has a smaller form factor (e.g., lower height) due to the fact that the capacitor 370 and the inductor 380 share a portion of an interconnect. Thus, the inductor 380 does not need to be on a different metal layer than the capacitor 370. Second, the sharing of an interconnect between the capacitor and the inductor uses less metal and thus may lower the overall cost of the integrated device. Third, combining the capacitor and the inductor so that they share some of the interconnect provides better overall performance for the capacitor and the inductor. For example, sharing an interconnect provides a capacitor and an inductor that can be configured to operate as a low pass filter with improved performance. An example of a low pass filter is illustrated and described below in FIG. 4.

Other technical challenges that are addressed in the disclosure include thickness control and overcoming delamination of the dielectric layer from an interconnect when fabricating a capacitor. In some implementations, to fabricate the integrated devices described in the disclosure, delamination (e.g., peeling) of the first dielectric layer 325 from the interconnect 330 has to be avoided or minimized. In some implementations, integrated devices that include a capacitor and inductor structure that share a portion of an interconnect may be fabricated by using one or more of the processes described in the disclosure.

An interconnect is an element or component of a device (e.g., integrated device, integrated passive device (IPD), integrated circuit (IC) package, integrated circuit (IC) device, die) and/or a base (e.g., device package base, package substrate, printed circuit board (PCB), interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect includes an electrically conductive material that provides an electrical path for a signal (e.g., data signal, ground signal, power signal). An interconnect may include more than one interconnect. An interconnect may include one or more metals (e.g., copper, aluminum, nickel, etc . . . ).

Figure 4:
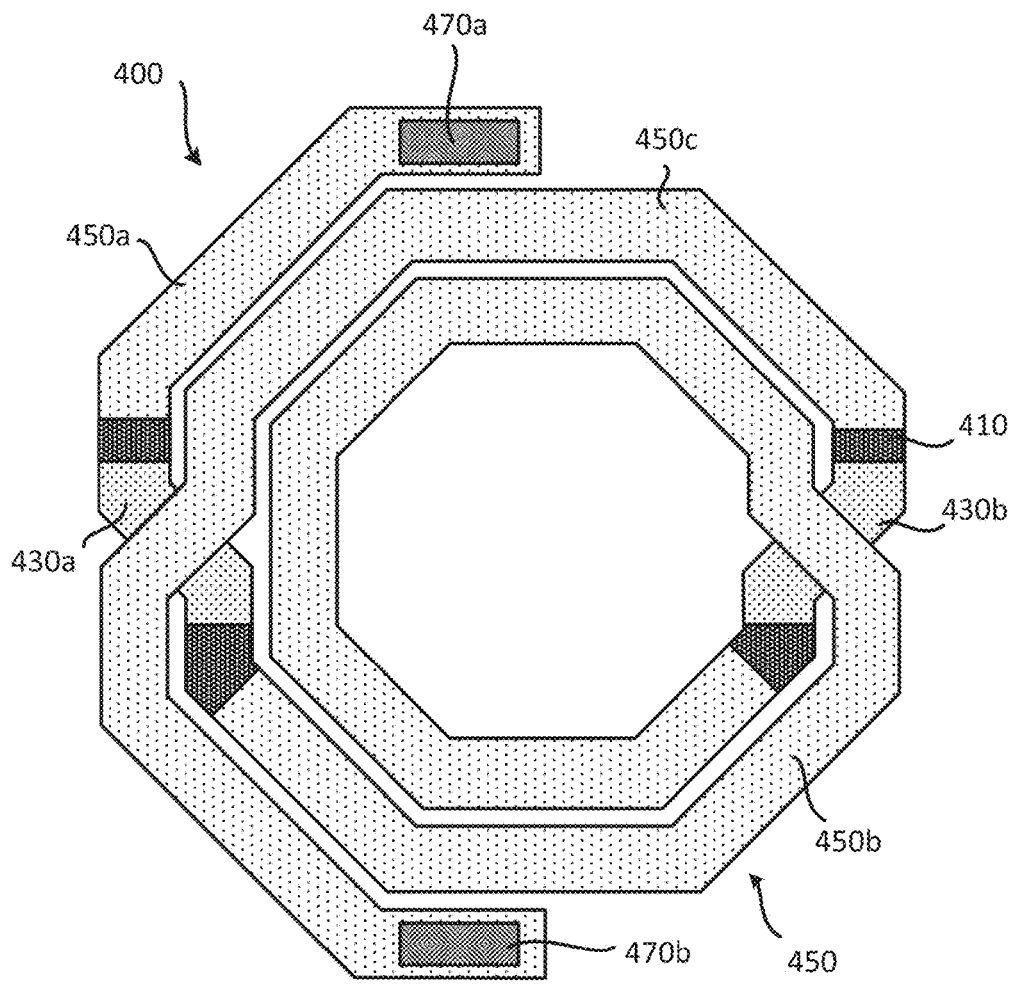
FIG. 4 illustrates a plan view of an integrated device that includes an inductor and a capacitor that share a portion of an interconnect.

FIG. 4 illustrates a plan view of an integrated device 400 that includes a capacitor and an inductor. In some implementations, the integrated device 400 is configured to operate as a low pass filter. For example, the combination of the first capacitor 470a, the second capacitor 470b and the inductor 450 may be configured to operate as a low pass filter. (e.g., LC LC low pass filter).

FIG. 4 illustrates two capacitors (e.g., 470a, 470b). However, different implementations may use different numbers of capacitors. The capacitors (e.g., 470a, 470b) may be the same or similar to the capacitor 370 of FIG. 3 or any of the capacitors described in the disclosure. The capacitors 470a and 470b may include interconnects from a first metal layer (M1) and interconnects from a second metal layer (M2). The capacitors (e.g., 470a, 470b) may have similar or different sizes and/or shapes.

FIG. 4 also illustrates the inductor 450. As shown in FIG. 4, the inductor 450 includes 2.5 loops. However, it is noted that the inductor 450 may have different numbers of loops (e.g., 0.5, 1, 1.5, etc. . . . ). The inductor 450 includes interconnect 430a, interconnect 430b, interconnect 450a, interconnect 450b and interconnect 450c. The interconnect 430a and the interconnect 430b may be an inductor underpass that is located on a first metal layer (M1). In some implementations, the interconnect 430a and/or the interconnect 430b are similar to the interconnect 330. The interconnect 450a, the interconnect 450b and the interconnect 450c may be interconnect on a second metal layer (M2). The interconnect 450a, the interconnect 450b and/or the interconnect 450c may be similar or the same as the second interconnect 350.

FIG. 4 illustrates at least one inductor overlap area 410. The inductor overlap area 410 is an area of the interconnect(s) on the first metal layer (M1) that overlaps with interconnect(s) on the second metal layer (M2), or vice versa. In some implementations, at least one via (e.g., via 340) may be located between the first metal layer (M1) and the second metal layer (M2) in the inductor overlap area 410.

It is noted that the configuration of the integrated device 400 may be changed or modified to include other shapes, designs, sizes, dimensions and/or components, including using one or more capacitors and/or one or more inductors with different designs. For example, the configuration of the integrated device 400 may implement the integrated device 300, the integrated device 500, the integrated device 600 and/or combinations thereof.

Figure 5:
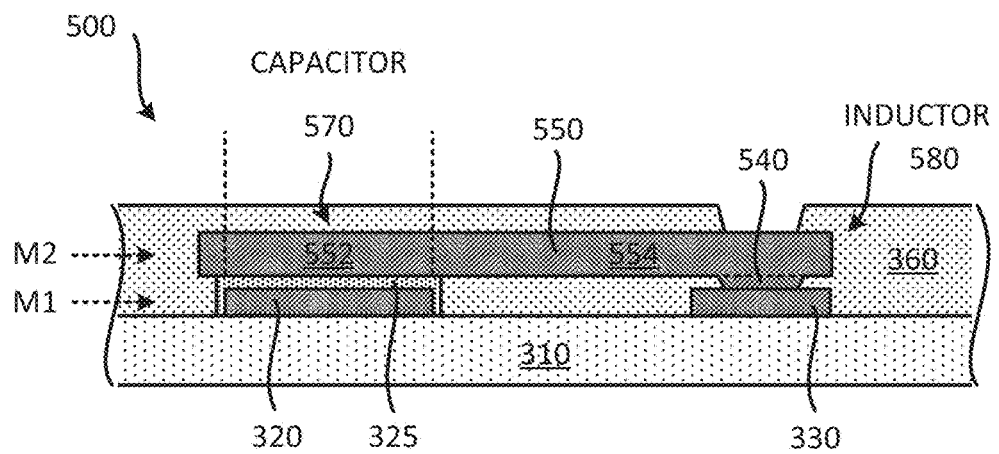
FIG. 5 illustrates a plan view of an integrated device that includes an inductor and a capacitor that share a portion of an interconnect.

FIG. 5 illustrates an integrated device 500 that includes the capacitor 570 and the inductor 580. The integrated device 500 is similar to the integrated device 300 of FIG. 3. In some implementations, the combination of the capacitor 570 and the inductor 580 may form a capacitor and inductor structure. The integrated device 500 includes the substrate 310, the first interconnect 320, the first dielectric layer 325, the interconnect 330, an interconnect 540, a second interconnect 550 and the second dielectric layer 360. The second interconnect 550 includes a first portion 552 and a second portion 554. The first interconnect 320 may be a first metal layer (M1) of the integrated device 500, and the second interconnect 550 may be a second metal layer (M2) of the integrated device 500. As shown in FIG. 5, the second interconnect 550 and the interconnect 540 are contiguous. In some implementations, the integrated device 500 may be an integrated passive device (IPD). It is noted that the integrated device 500 may be part of a semiconductor die, an integrated package (e.g., integrated circuit (IC) package), a package substrate, an interposer and/or printed circuit board (PCB).

The capacitor 570 may be a means for capacitance. The capacitor 570 includes the first interconnect 320, the first dielectric layer 325 and the first portion 552 of the second interconnect 550. As such, the first interconnect 320, the first dielectric layer 325 and a portion of the second interconnect 550 may be configured to operate as the capacitor 570. The first dielectric layer 325 is located between the first interconnect 320 and the first portion 552 of the second interconnect 550. The first interconnect 320, the first dielectric layer 325 and the first portion of the second interconnect 550 at least partially vertically overlap with each other. The first dielectric layer 325 may also laterally surround the first interconnect 320. That is, the first dielectric layer 325 may be formed on the side portions of the first interconnect 320.

The inductor 580 may be a means for inductance. The inductor 580 may include the second interconnect 550. More, specifically, the inductor 580 may include the first portion 552 of the second interconnect 550 and the second portion 554 of the second interconnect 550. As such, the second interconnect 550 may be configured to operate as the inductor 580. As shown in FIG. 5, the inductor 580 shares a portion of the second interconnect 550 with the capacitor 570. In particular, the inductor 580 and the capacitor 570 share the first portion 552 of the second interconnect 550. As such, the first portion 552 of the second interconnect 550 is part of the capacitor 570 and the inductor 580. The inductor 580 may also include the interconnect 330 and the interconnect 540. The interconnect 540 may be a via. The interconnect 330 may be a trace or pad of the inductor 580. The interconnect 330 may form a terminal or winding of the inductor 580.

Figure 6:
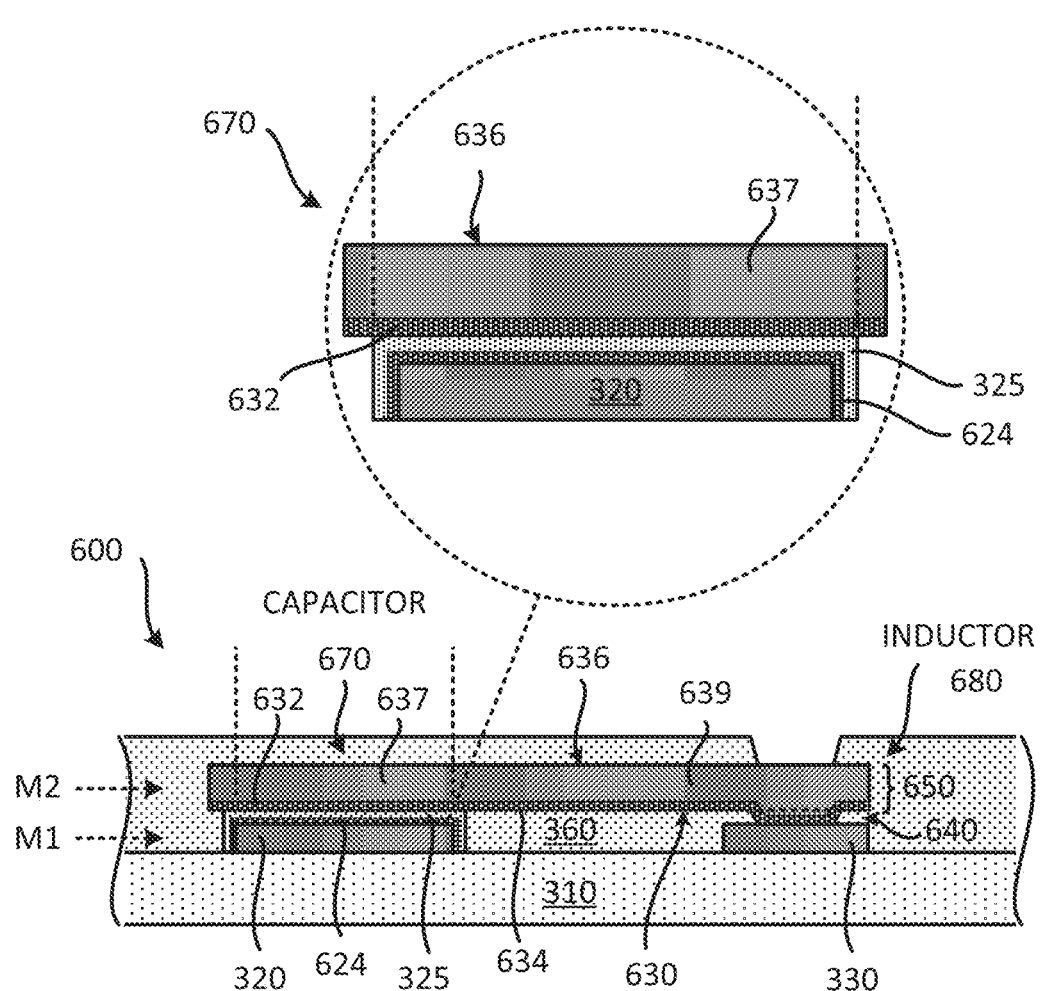
FIG. 6 illustrates a plan view of an integrated device that includes an inductor and a capacitor that share a portion of an interconnect.

FIG. 6 illustrates an integrated device 600 that includes the capacitor 670 and the inductor 680. The integrated device 600 is similar to the integrated device 300 of FIG. 3 and/or the integrated device 500 of FIG. 5. In some implementations, the integrated device 600 may be a more detailed version of the integrated device 300 and/or the integrated device 500. In some implementations, the combination of the capacitor 670 and the inductor 680 may form a capacitor and inductor structure.

The integrated device 600 includes the substrate 310, the first interconnect 320, an adhesion layer 624, the first dielectric layer 325, the interconnect 330, an interconnect 640, a second interconnect 650 and the second dielectric layer 360. The second interconnect 650 includes a seed layer 630 and a metal layer 636. The seed layer 630 includes a first portion 632 and a second portion 634. The metal layer 636 includes a first portion 637 and a second portion 639. The first interconnect 320 may be a first metal layer (M1) of the integrated device 600, and the second interconnect 650 may be a second metal layer (M2) of the integrated device 600. In some implementations, the integrated device 600 may be an integrated passive device (IPD). It is noted that the integrated device 600 may be part of a semiconductor die, an integrated package (e.g., integrated circuit (IC) package), a package substrate, an interposer and/or printed circuit board (PCB).

The capacitor 670 may be a means for capacitance. The capacitor 670 includes the first interconnect 320, the adhesion layer 624, the first dielectric layer 325 and a first portion of the second interconnect 650. As such, the first interconnect 320, the adhesion layer 624, the first dielectric layer 325 and a portion of the second interconnect 650 may be configured to operate as the capacitor 670. The adhesion layer 624 is located between the first interconnect 320 and the first dielectric layer 325. The first dielectric layer 325 is located between the adhesion layer 624 and the first portion of the second interconnect 650. The adhesion layer 624 helps prevent the first dielectric layer 325 from delaminating. The adhesion layer 624 may be a means for adhesion. The first interconnect 320, the adhesion layer 624, the first dielectric layer 325 and the first portion of the second interconnect 650 at least partially vertically overlap with each other. The first portion of the second interconnect 650 may include the first portion 632 of the seed layer 630, and the first portion 637 of the metal layer 636. The adhesion layer 624 may laterally surround the first interconnect 320. That is, the adhesion layer 624 may be formed on the side portions of the first interconnect 320. The first dielectric layer 325 may laterally surround the adhesion layer 624. That is, the first dielectric layer 325 may be formed on the side portions of the adhesion layer 624.

The inductor 680 may be a means for inductance. The inductor 680 may include the second interconnect 650. More, specifically, the inductor 680 may include the seed layer 630 and the metal layer 636. The inductor 680 may include a first portion of the second interconnect 650 and a second portion of the second interconnect 650. As such, the second interconnect 650 may be configured to operate as the inductor 680. As shown in FIG. 6, the inductor 680 shares a portion of the second interconnect 650 with the capacitor 670. In particular, the inductor 680 and the capacitor 670 share the first portion of the second interconnect 650. As such, the first portion of the second interconnect 650 is part of the capacitor 670 and the inductor 680. The first portion of the second interconnect 650 may include the first portion 632 of the seed layer 630, and the first portion 637 of the metal layer 636. The inductor 680 may also include the interconnect 330 and the interconnect 640. The interconnect 640 may be a via. The interconnect 330 may be a trace or pad of the inductor 680. The interconnect 330 may form a terminal or winding of the inductor 680.

Different implementations may use different materials, dimensions and/or shapes for the capacitor(s) and/or the inductor(s) described in the disclosure. Below are different examples of materials and dimensions for the capacitor(s) and/or the inductor(s).

Exemplary Materials and Dimensions for an Integrated Device Comprising a Capacitor and Inductor Structure FIGS. 3-6 describe various capacitors and inductors in integrated devices. These capacitors and inductors may have similar or different materials, sizes, shapes, designs and/or dimensions.

In some implementations, the first interconnect (e.g., 320) may include a thickness in a range of about 1-3 micrometers ($\mu$m). In some implementations, the first dielectric layer may (e.g., 325) include a thickness in a range of about 0.1-0.4 micrometers ($\mu$m). In some implementations, the second interconnect (e.g., 350, 550, 650) may include a thickness in a range of about 7-20 micrometers ($\mu$m). In some implementations, the adhesion layer (e.g., 624) may include a thickness of about 0.1-1 micrometer ($\mu$m). In some implementations, the seed layer (e.g., 630) may include a thickness in a range of about 0.2-1 micrometer ($\mu$m).

The first interconnect (e.g., 320) and/or the second interconnect (e.g., 350, 550, 650) may include aluminum (e.g., aluminum alloy) and/or copper (e.g., copper alloy). The seed layer (e.g., 630) may include titanium (e.g., titanium alloy). The adhesion layer (e.g., 624) may include titanium (e.g., titanium alloy). The adhesion layer may be a barrier layer. The first dielectric layer (e.g., 325) may include a high dielectric constant ($\kappa$) dielectric layer. A high dielectric constant ($\kappa$) may include dielectric constants in a range of about 10-60. The first dielectric layer (e.g., 325) may include silicon nitride. The second dielectric layer (e.g., 360) may include a low dielectric constant ($\kappa$) dielectric layer. A low dielectric constant ($\kappa$) may include dielectric constants in a range of about 1-10.

However, different implementations may use different materials, dimensions and/or shapes for the capacitor(s) and/or the inductor(s) described in the disclosure.

In some implementations, the above exemplary thicknesses are relevant because as thicknesses for interconnects and dielectrics get thinner and thinner, delamination (e.g., peeling) becomes a problem, especially for certain materials because some materials have better adhesion than other materials. For example, aluminum (e.g., aluminum alloy) has better adhesion to a dielectric than copper, and thus aluminum is less subject to peeling from a dielectric than copper. In some implementations, to fabricate the integrated devices that include the above thicknesses and/or materials, delamination (e.g., peeling) of the first dielectric layer 325 from the interconnect 330 has to be avoided or minimized. Thus, technical challenges that are addressed in the disclosure include thickness control and overcoming delamination of the dielectric layer from an interconnect, or vice versa, when fabricating a capacitor, especially for thicknesses described above. Applicants submit that the disclosure provides one or more processes capable of fabricating integrated devices that include the above exemplary thicknesses and/or materials.

Figure 7A:
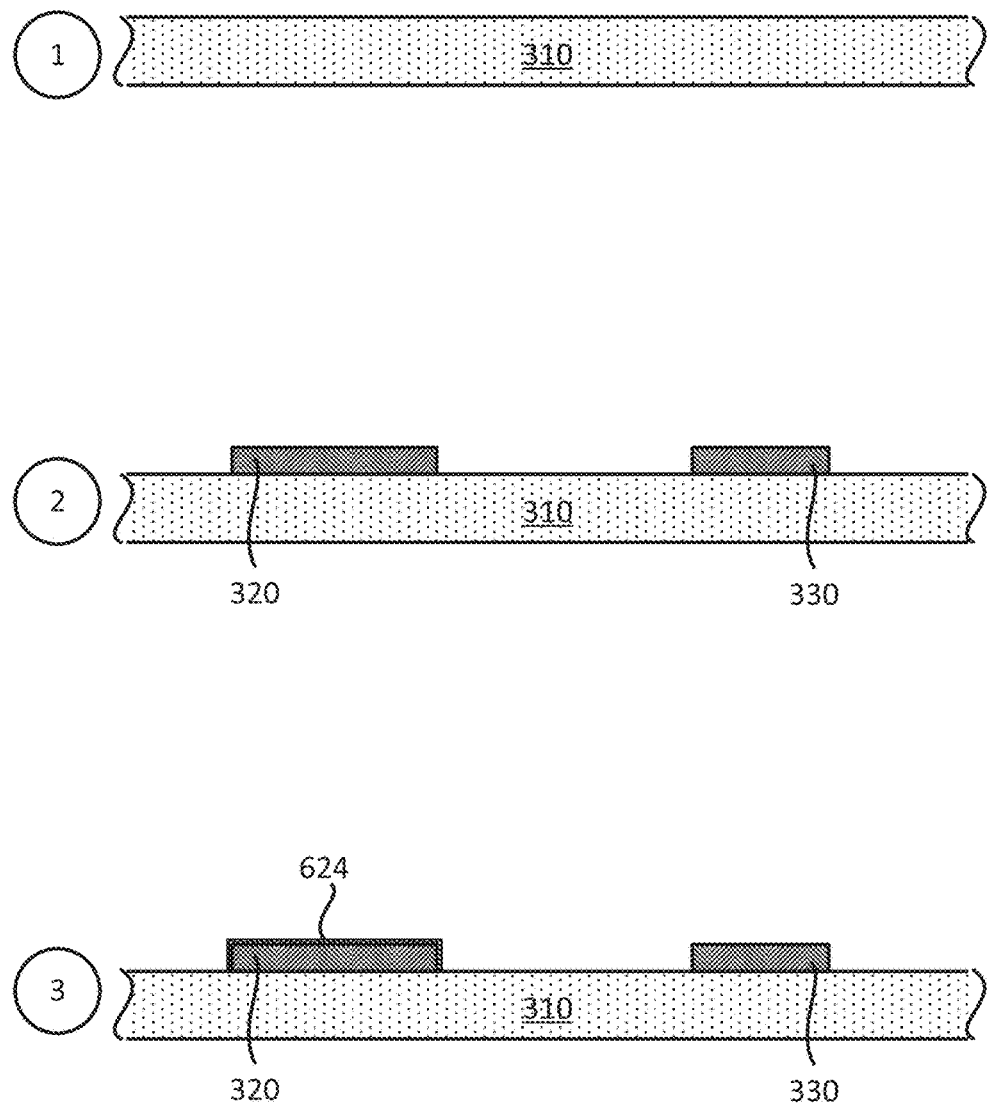
FIG. 7 (comprising FIGS. 7A-7C) illustrates an exemplary sequence for fabricating an integrated device that includes an inductor and a capacitor that share a portion of an interconnect.
Figure 7B:
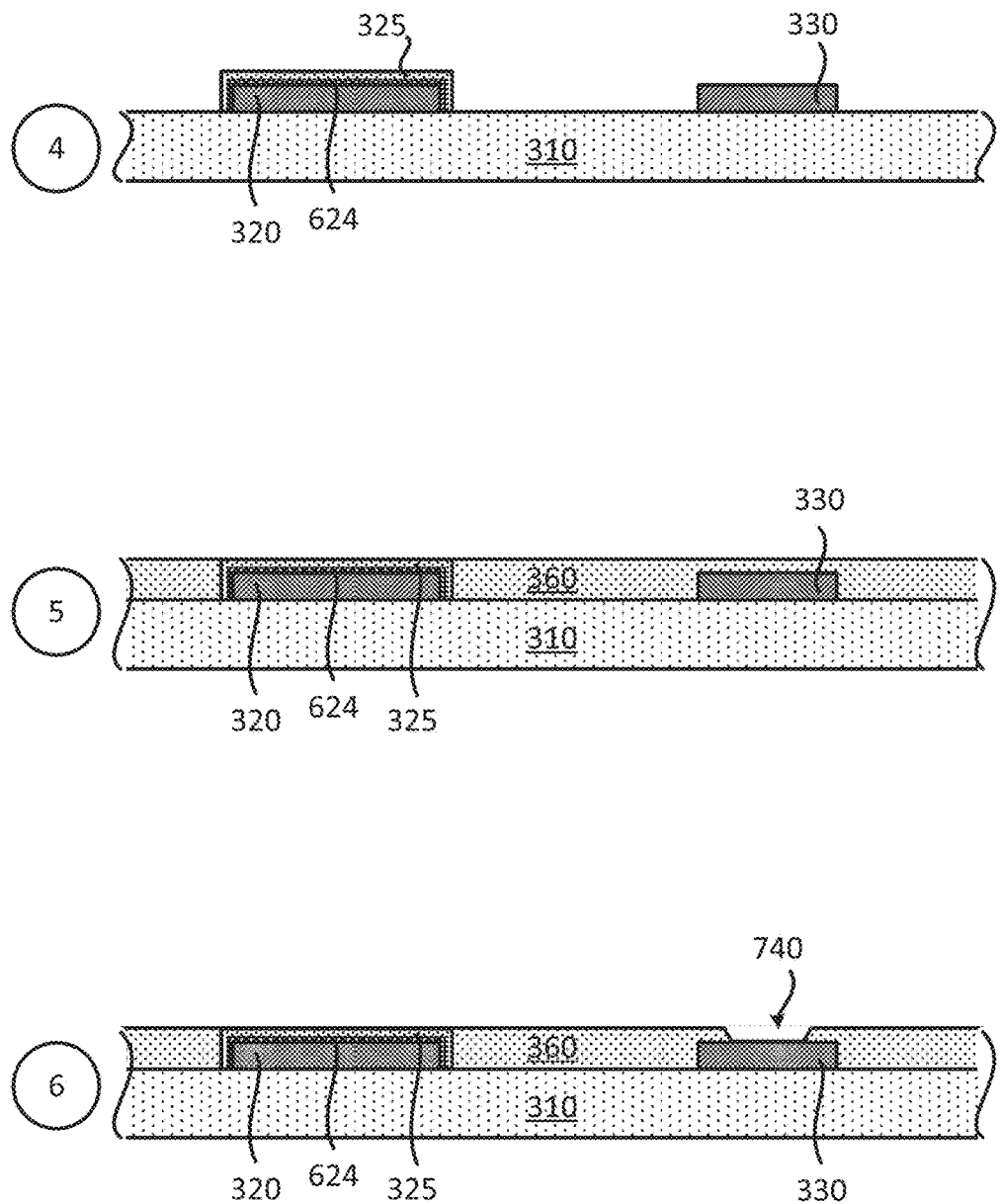
Figure 7C:
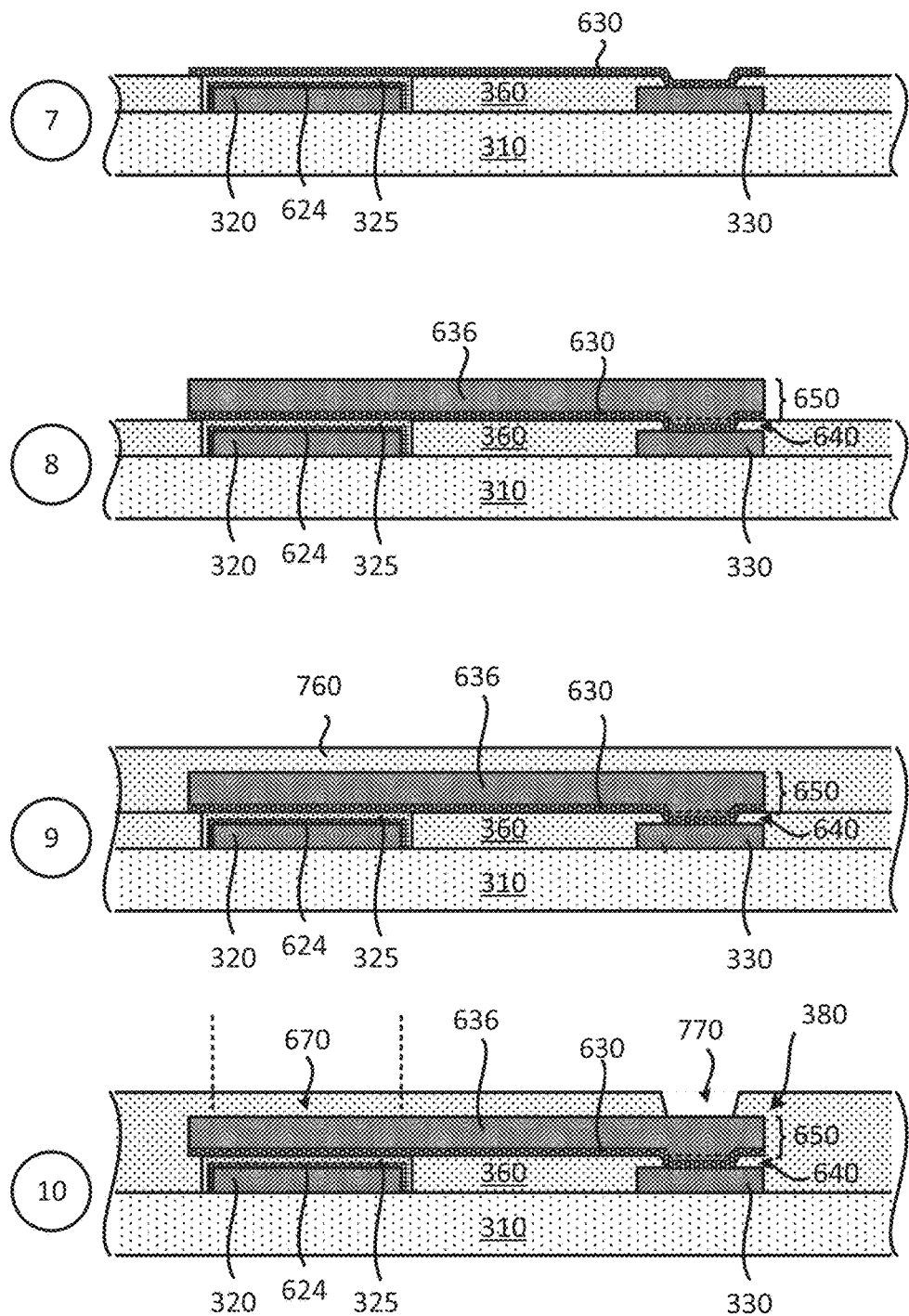

Exemplary Sequence for Fabricating an Integrated Device Comprising a Capacitor and Inductor Structure In some implementations, fabricating an integrated device that includes a capacitor and inductor structure that includes a shared interconnect includes several processes. FIG. 7 (which includes FIGS. 7A-7C) illustrates an exemplary sequence for providing or fabricating an integrated device that includes a capacitor and inductor structure that includes a shared interconnect. In some implementations, the sequence of FIGS. 7A-7C may be used to provide or fabricate the integrated device of FIGS. 3, 4, 5, 6 and/or other integrated devices described in the present disclosure.

It should be noted that the sequence of FIGS. 7A-7C may combine one or more stages in order to simplify and/or clarify the sequence for providing or fabricating an integrated device that includes a capacitor and inductor structure that includes a shared interconnect. In some implementations, the order of the processes may be changed or modified. In some implementations, one or more of processes may be replaced or substituted without departing from the spirit of the disclosure.

Stage 1, as shown in FIG. 7A, illustrates a state after a substrate 310 is provided. Different implementations may provide different materials for the substrate 310. In some implementations, the substrate 310 may include silicon.

Stage 2 illustrates a state after the first interconnect 320 and the interconnect 330 are formed over the substrate 310. In some implementations, a plating and patterning process is used to form the first interconnect 320 and the interconnect 330. Other interconnects may also be formed. In some implementations, the first interconnect 320 and the interconnect 330 are part of the first metal layer (M1) of the integrated device.

Stage 3 illustrates a state after an adhesion layer 624 is formed over the first interconnect 320. In some implementations, the adhesion layer 624 is optional.

Stage 4, as shown in FIG. 7B, illustrates a state after a first dielectric layer 325 is formed over the adhesion layer 624. If there is no adhesion layer 624, then the first dielectric layer 325 may be formed over the first interconnect 320.

Stage 5 illustrates a state after the second dielectric layer 360 is formed over the substrate 310, the first dielectric layer 325 and the interconnect 330. Different implementations may provide the second dielectric layer 360 differently. In some implementations, the second dielectric layer 360 includes multiple dielectric layers.

Stage 6 illustrates a state after at least one cavity 740 is formed in the second dielectric layer 360. In some implementations, a laser process (e.g., laser ablation) is used to form one or more cavities in the second dielectric layer 360.

Stage 7, as shown in FIG. 7C, illustrates a state after a seed layer 630 is formed over the first dielectric layer 325 and the second dielectric layer 360. A plating process may be used to provide the seed layer 630.

Stage 8 illustrates a state after a metal layer 636 is formed over the seed layer 630. In some implementations, the seed layer 630 and the metal layer 626 may form the second interconnect 650 and the interconnect 640. In some implementations, the second interconnect 650 is part of the second metal layer (M2) of the integrated device.

Stage 9 illustrates a state after the second dielectric layer 760 is formed over the second interconnect 650. Different implementations may provide the second dielectric layer 760 differently. In some implementations, the second dielectric layer 760 includes multiple dielectric layers. In some implementations, the second dielectric layer 760 is similar to the second dielectric layer 360.

Stage 10 illustrates a state after at least one cavity 770 is formed in the second dielectric layer 360. At stage 10, the second dielectric layer 360 may represent the second dielectric layer 360 and/or the second dielectric layer 760. In some implementations, a laser process (e.g., laser ablation) is used to form one or more cavities in the second dielectric layer 360.

Figure 8:
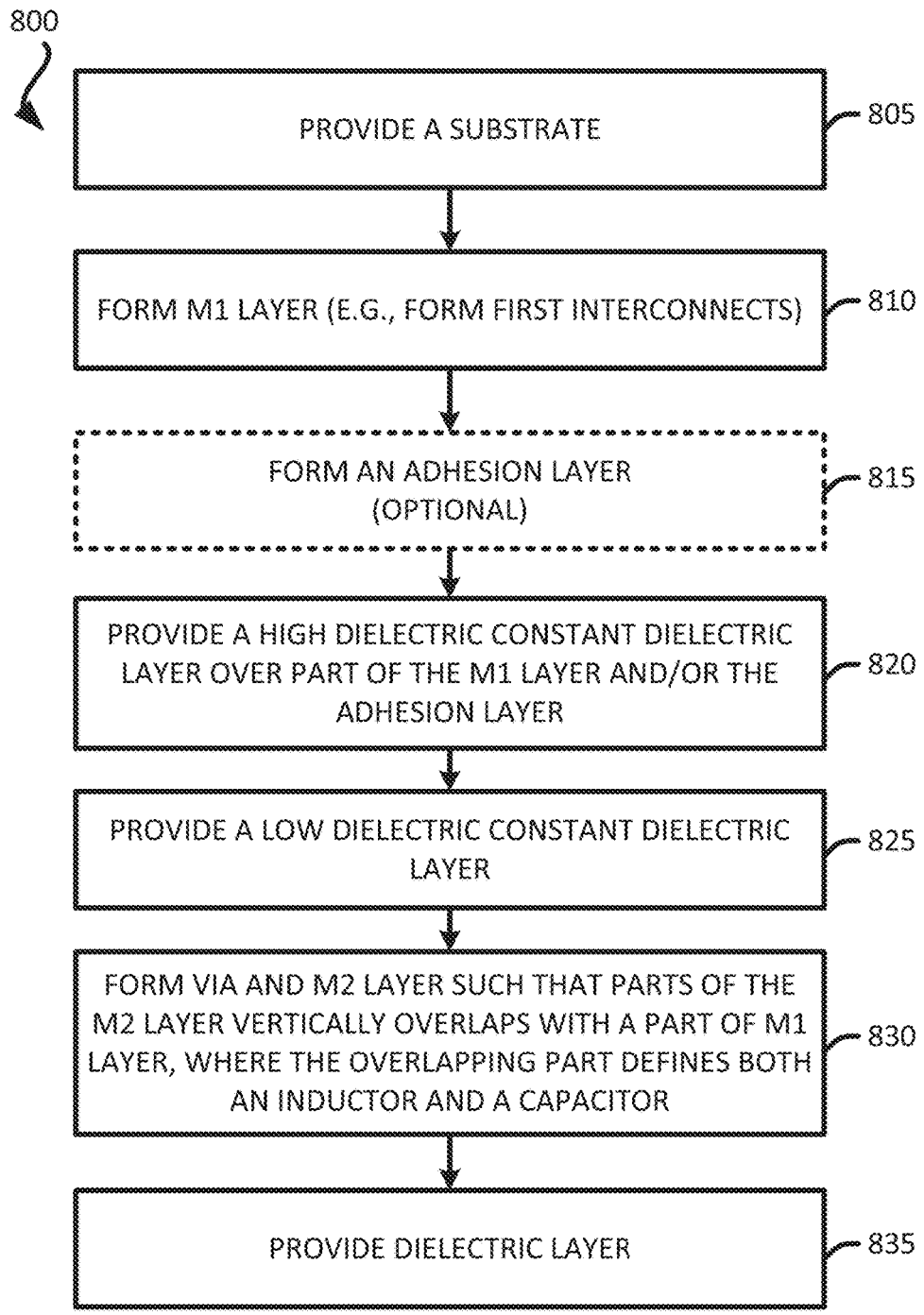
FIG. 8 illustrates an exemplary flow diagram of a method for fabricating an integrated device that includes an inductor and a capacitor that share a portion of an interconnect.

Exemplary Flow Diagram of a Method for Fabricating an Integrated Device Comprising a Capacitor and Inductor Structure In some implementations, providing an integrated device that includes a capacitor and inductor structure that includes a shared interconnect includes several processes. FIG. 8 illustrates an exemplary flow diagram of a method 800 for providing or fabricating an integrated device that includes a capacitor and inductor structure that includes a shared interconnect. In some implementations, the method 800 of FIG. 8 may be used to provide or fabricate the integrated devices of FIGS. 3, 4, 5, 6 and/or other integrated devices described in the present disclosure.

It should be noted that the sequence of FIG. 8 may combine one or more processes in order to simplify and/or clarify the method for providing or fabricating an integrated device that includes a capacitor and inductor structure that includes a shared interconnect. In some implementations, the order of the processes may be changed or modified.

The method provides (at 805) a substrate (e.g., 310). Different implementations may provide different materials for the substrate. In some implementations, the substrate may include silicon.

The method forms (at 810) interconnects (e.g., first interconnect 320, interconnect 330). In some implementations, the first interconnect 320 and the interconnect 330 are part of the first metal layer (M1) of the integrated device.

The method forms (at 815) an adhesion layer (e.g., 624) over the first interconnect 320. In some implementations, the adhesion layer 624 is optional.

The method forms (at 820) a first dielectric layer (e.g., 325) over the adhesion layer 624. If there is no adhesion layer 624, then the first dielectric layer 325 may be formed over the first interconnect 320. The first dielectric layer may be a high dielectric constant (κ) dielectric layer.

The method forms (at 825) a second dielectric layer (e.g., 360) over the substrate 310, the first dielectric layer 325 and the interconnect 330. Different implementations may provide the second dielectric layer 360 differently. In some implementations, second dielectric layer 360 includes multiple dielectric layers. In some implementations, the second dielectric layer may be a low dielectric constant (κ) dielectric layer.

The method forms (at 830) a second interconnect (e.g., 350, 550, 650). In some implementations, forming the second interconnect includes forming a seed layer and a metal layer. The second interconnect may be configured to operate as an inductor. Portions of the second interconnect may be configured to operate as a capacitor. In some implementations, the second interconnect (e.g., 350, 550, 650) is part of the second metal layer (M2) of the integrated device.

The method forms (at 835) the second dielectric layer 360 over the second interconnect (e.g., 350, 550, 650). Different implementations may provide the second dielectric layer 360 differently. In some implementations, the second dielectric layer 360 includes multiple dielectric layers.

It is also noted that the method 800 of FIG. 8 may be used to fabricate (e.g., concurrently fabricate) several integrated devices on a wafer. The wafer is then singulated (e.g., cut) into individual integrated devices. These singulated integrated devices may then be coupled to dies and/or printed circuit boards (PCBs).

Exemplary Semi-Additive Patterning (SAP) Process

Various metal layer and interconnects (e.g., traces, vias, pads) are described in the present disclosure. These metal layers and interconnects may be formed in a die, a package substrate, an encapsulation layer, an encapsulation portion, an integrated device and/or an integrated passive device (IPD). In some implementations, these interconnects may include one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes. These plating processes are described to form interconnects in and/or on a dielectric layer. In some implementations, these plating processes may be used to form interconnects in and/or on an encapsulation layer.

Different implementations may use different processes to form and/or fabricate the metal layers (e.g., interconnects, redistribution layer, under bump metallization layer,). In some implementations, these processes include a semi-additive patterning (SAP) process and/or a damascene process. These various different processes are further described below.

Figure 9:
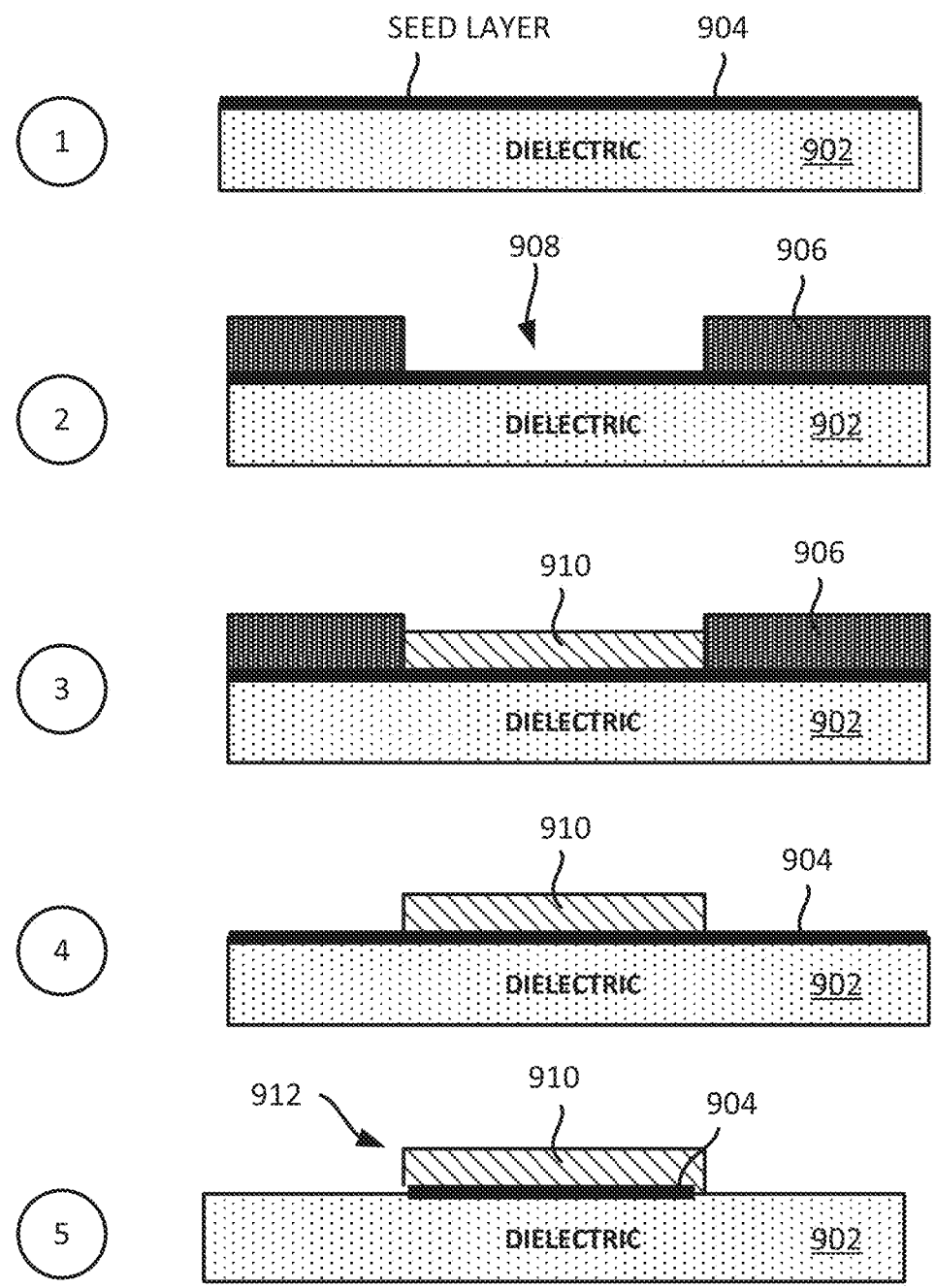
FIG. 9 illustrates an exemplary sequence of a semi-Additive Patterning (SAP) process.

FIG. 9 illustrates a sequence for forming an interconnect using a semi-additive patterning (SAP) process to provide and/or form an interconnect in one or more dielectric layer(s). As shown in FIG. 9, stage 1 illustrates a state of an integrated device (e.g., substrate) after a dielectric layer 902 is provided (e.g., formed). In some implementations, stage 1 illustrates that the dielectric layer 902 includes a first metal layer 904. The first metal layer 904 is a seed layer in some implementations. In some implementations, the first metal layer 904 may be provided (e.g., formed) on the dielectric layer 902 after the dielectric layer 902 is provided (e.g., received or formed). Stage 1 illustrates that the first metal layer 904 is provided (e.g., formed) on a first surface of the dielectric layer 902. In some implementations, the first metal layer 904 is provided by using a deposition process (e.g., PVD, CVD, plating process).

Stage 2 illustrates a state of the integrated device after a photo resist layer 906 (e.g., photo develop resist layer) is selectively provided (e.g., formed) on the first metal layer 904. In some implementations, selectively providing the photo resist layer 906 includes providing a photo resist layer 906 on the first metal layer 904 and selectively removing portions of the photo resist layer 906 by developing (e.g., using a development process). Stage 2 illustrates that the photo resist layer 906 is provided such that a cavity 908 is formed.

Stage 3 illustrates a state of the integrated device after a second metal layer 910 is formed in the cavity 908. In some implementations, the second metal layer 910 is formed over an exposed portion of the first metal layer 904. In some implementations, the second metal layer 910 is provided by using a deposition process (e.g., plating process).

Stage 4 illustrates a state of the integrated device after the photo resist layer 906 is removed. Different implementations may use different processes for removing the photo resist layer 906.

Stage 5 illustrates a state of the integrated device after portions of the first metal layer 904 are selectively removed. In some implementations, one or more portions of the first metal layer 904 that is not covered by the second metal layer 910 is removed. As shown in stage 5, the remaining first metal layer 904 and the second metal layer 910 may form and/or define an interconnect 912 (e.g., trace, vias, pads) in an integrated device and/or a substrate. In some implementations, the first metal layer 904 is removed such that a dimension (e.g., length, width) of the first metal layer 904 underneath the second metal layer 910 is about the same or smaller than a dimension (e.g., length, width) of the second metal layer 910, which can result in an undercut, as shown at stage 5 of FIG. 9. In some implementations, the above mentioned processes may be iterated several times to provide and/or form several interconnects in one or more dielectric layers of an integrated device and/or a substrate.

Figure 10:
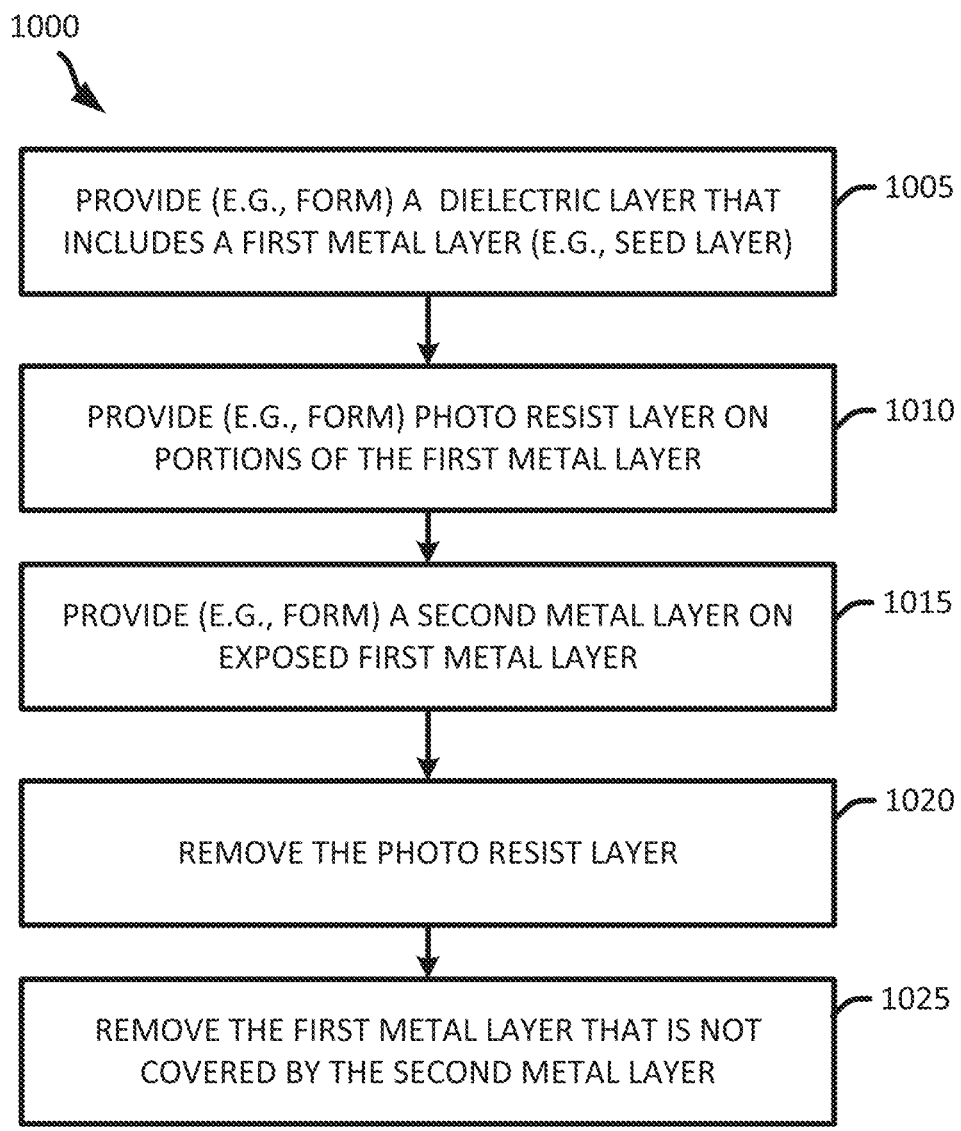
FIG. 10 illustrates an exemplary flow diagram of a semi-Additive Patterning (SAP) process.

FIG. 10 illustrates a flow diagram for a method for using a (SAP) process to provide and/or form an interconnect in one or more dielectric layer(s). The method provides (at 1005) a dielectric layer (e.g., dielectric layer 902). In some implementations, providing the dielectric layer includes forming the dielectric layer. In some implementations, providing the dielectric layer includes forming a first metal layer (e.g., first metal layer 904). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1010) a photo develop resist layer (e.g., a photo resist layer 906) on the first metal layer. In some implementations, selectively providing the photo resist layer includes providing a photo resist layer on the first metal layer and selectively removing portions of the photo resist layer (which provides one or more cavities).

The method then provides (at 1015) a second metal layer (e.g., second metal layer 910) in the cavity of the photo resist layer. In some implementations, the second metal layer is formed over an exposed portion of the first metal layer. In some implementations, the second metal layer is provided by using a deposition process (e.g., plating process).

The method further removes (at 1020) the photo resist layer. Different implementations may use different processes for removing the photo resist layer. The method also selectively removes (at 1025) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 11:
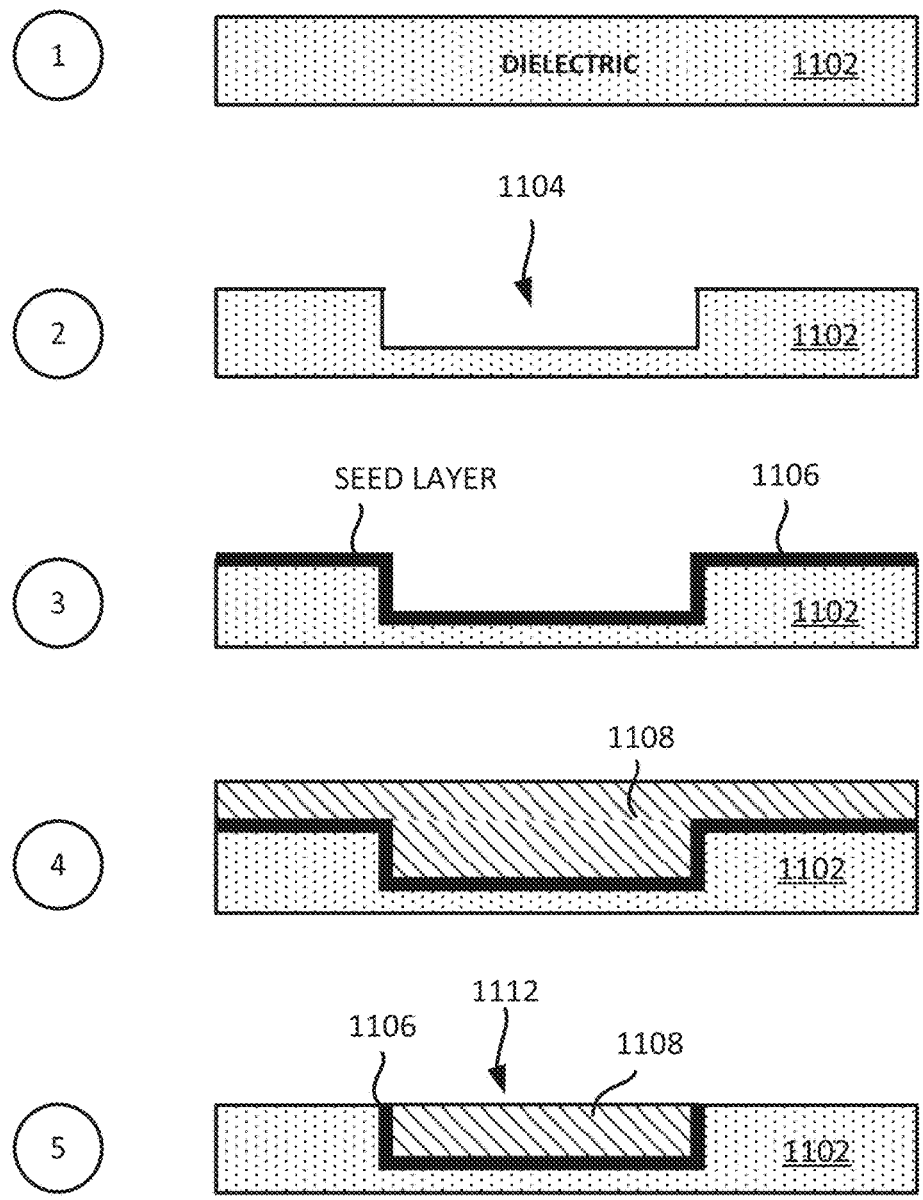
FIG. 11 illustrates an exemplary sequence of a damascene process.

FIG. 11 illustrates a sequence for forming an interconnect using a damascene process to provide and/or form an interconnect in a dielectric layer. As shown in FIG. 11, stage 1 illustrates a state of an integrated device after a dielectric layer 1102 is provided (e.g., formed). In some implementations, the dielectric layer 1102 is an inorganic layer (e.g., inorganic film).

Stage 2 illustrates a state of an integrated device after a cavity 1104 is formed in the dielectric layer 1102. Different implementations may use different processes for providing the cavity 1104 in the dielectric layer 1102.

Stage 3 illustrates a state of an integrated device after a first metal layer 1106 is provided on the dielectric layer 1102. As shown in stage 3, the first metal layer 1106 provided on a first surface of the dielectric layer 1102. The first metal layer 1106 is provided on the dielectric layer 1102 such that the first metal layer 1106 takes the contour of the dielectric layer 1102 including the contour of the cavity 1104. The first metal layer 1106 is a seed layer in some implementations. In some implementations, the first metal layer 1106 is provided by using a deposition process (e.g., physical vapor deposition (PVD), Chemical Vapor Deposition (CVD) or plating process).

Stage 4 illustrates a state of the integrated device after a second metal layer 1108 is formed in the cavity 1104 and a surface of the dielectric layer 1102. In some implementations, the second metal layer 1108 is formed over an exposed portion of the first metal layer 1106. In some implementations, the second metal layer 1108 is provided by using a deposition process (e.g., plating process).

Stage 5 illustrates a state of the integrated device after the portions of the second metal layer 1108 and portions of the first metal layer 1106 are removed. Different implementations may use different processes for removing the second metal layer 1108 and the first metal layer 1106. In some implementations, a chemical mechanical planarization (CMP) process is used to remove portions of the second metal layer 1108 and portions of the first metal layer 1106. As shown in stage 5, the remaining first metal layer 1106 and the second metal layer 1108 may form and/or define an interconnect 1112 (e.g., trace, vias, pads) in an integrated device and/or a substrate. As shown in stage 5, the interconnect 1112 is formed in such a way that the first metal layer 1106 is formed on the base portion and the side portion(s) of the second metal layer 1108. In some implementations, the cavity 1104 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 12:
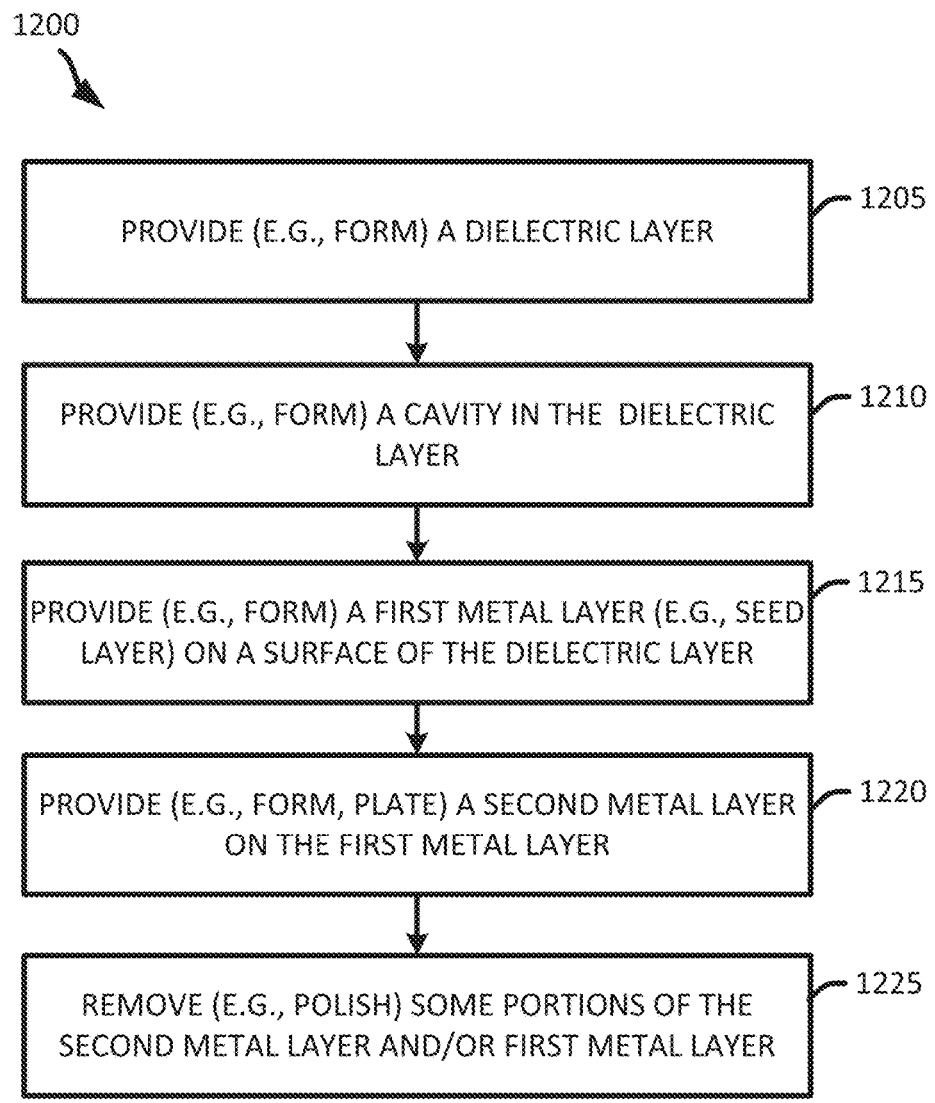
FIG. 12 illustrates an exemplary flow diagram of a damascene process.

FIG. 12 illustrates a flow diagram of a method 1200 for forming an interconnect using a damascene process to provide and/or form an interconnect in a dielectric layer. The method provides (at 1205) a dielectric layer (e.g., dielectric layer 1102). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1210) at least one cavity (e.g., cavity 1104) in the dielectric layer. Different implementations may use different processes for providing the cavity in the dielectric layer.

The method provides (at 1215) a first metal layer (e.g., first metal layer 1106) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 1106 is provided by using a deposition process (e.g., PVD, CVD or plating process).

The method provides (at 1220) a second metal layer (e.g., second metal layer 1108) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1225) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 1112). In some implementations, an interconnect may include a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 13:
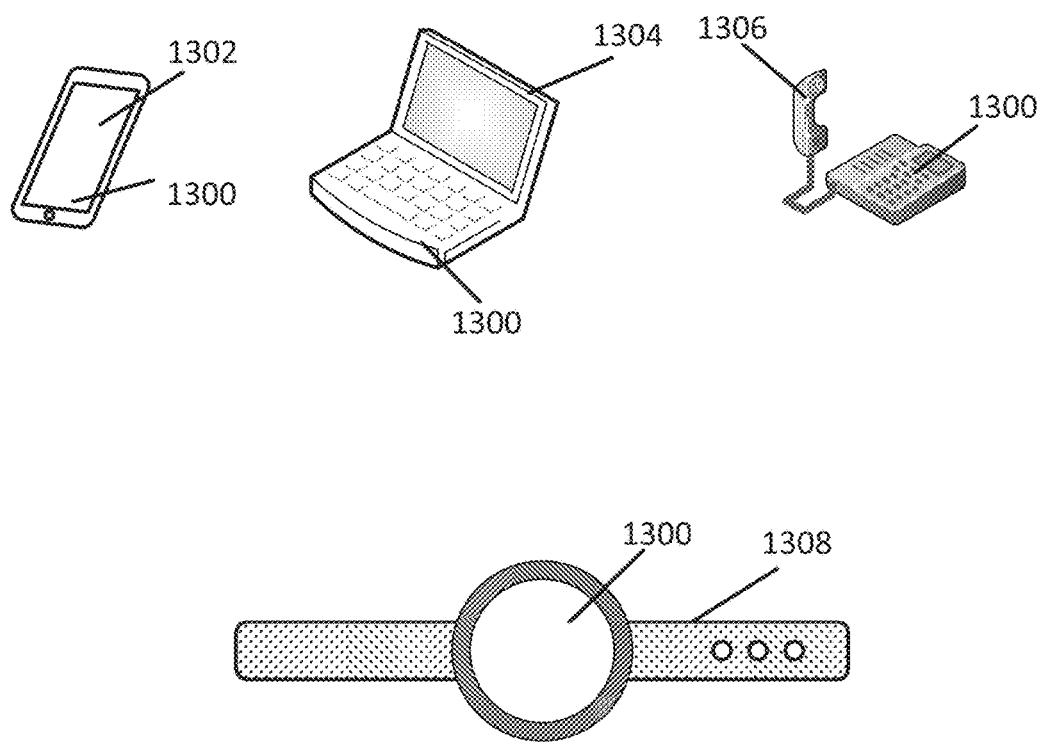
FIG. 13 illustrates various electronic devices that may integrate a die, an integrated device, an integrated passive device (IPD), a device package, a package, an integrated circuit and/or PCB described herein.

FIG. 13 illustrates various electronic devices that may be integrated with any of the aforementioned device, integrated device, integrated circuit (IC) package, integrated circuit (IC) device, semiconductor device, integrated circuit, die, interposer, package or package-on-package (PoP). For example, a mobile phone device 1302, a laptop computer device 1304, a fixed location terminal device 1306, or a wearable device 1308 may include a device 1300 as described herein. The device 1300 may be, for example, any of the devices and/or integrated circuit (IC) packages described herein. The devices 1302, 1304, 1306 and 1308 illustrated in FIG. 13 are merely exemplary. Other electronic devices may also feature the device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 3-6, 7A-7C and/or 8-13 may be rearranged and/or combined into a single component, process, feature or function or embodied in several components, processes, or functions. Additional elements, components, processes, and/or functions may also be added without departing from the disclosure. It should also be noted FIGS. 3-6, 7A-7C and/or 8-13 and its corresponding description in the present disclosure is not limited to dies and/or ICs. In some implementations, FIGS. 3-6, 7A-7C and/or 8-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:
1. An integrated device comprising:
a substrate;
a first interconnect over the substrate;
a second interconnect comprising a first portion and a second portion;

a first dielectric layer between the first interconnect and the first portion of the second interconnect such that the first interconnect vertically overlaps with the first dielectric layer and the first portion of the second interconnect, wherein the first dielectric layer comprises a first dielectric constant; and a second dielectric layer formed over the substrate,
wherein the second dielectric layer comprises a second dielectric constant that is different than the first dielectric constant, and
wherein the second dielectric layer laterally surrounds at least part of the first dielectric layer,
wherein the first interconnect, the first dielectric layer and the first portion of the second interconnect are configured to operate as a capacitor, and
wherein the first portion and the second portion of the second interconnect are configured to operate as an inductor.

2. The integrated device of claim 1, further comprising an adhesion layer between the first interconnect and the first dielectric layer.

3. The integrated device of claim 2, wherein the adhesion layer comprises titanium.

4. The integrated device of claim 1, wherein the second interconnect comprises a seed layer such that the seed layer is coupled to the first dielectric layer.

5. The integrated device of claim 1, wherein the first interconnect comprises a thickness in a range of about 1-3 micrometers (μm).

6. The integrated device of claim 1, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

7. The integrated device of claim 1,
wherein the first dielectric constant comprises a value in a range of about 10-60, and
wherein the second dielectric constant comprises a value in a range of about 1-10.

8. The integrated device of claim 1, further comprising:
another first interconnect formed on a same metal layer as the first interconnect;
a first portion of another second interconnect, wherein the other second interconnect is formed on a same metal layer as the second interconnect; and
another first dielectric layer located between the other first interconnect and the first portion of the other second interconnect such that the other first interconnect vertically overlaps with the other first dielectric layer and the first portion of the other second interconnect,
wherein the other first interconnect, the other first dielectric layer, and the first portion of the other second interconnect are configured to operate as another capacitor.

9. An integrated device comprising:
a substrate;
a first interconnect over the substrate;
a second interconnect comprising a first portion and a second portion;
a first dielectric layer between the first interconnect and the first portion of the second interconnect such that the first interconnect vertically overlaps with the first dielectric layer and the first portion of the second interconnect; and a second dielectric layer formed over the substrate,
wherein the first interconnect, the first dielectric layer and the first portion of the second interconnect are configured to operate as a capacitor,
wherein the first portion and the second portion of the second interconnect are configured to operate as an inductor,
wherein the first interconnect of the capacitor comprises a thickness in a range of about 1-3 micrometers (μtm),
wherein the first dielectric layer of the capacitor comprises a thickness in a range of about 0.1-0.4 micrometers (μm), and
wherein the first portion of the second interconnect of the capacitor comprises a thickness in a range of about 7-20 micrometers (μm).

10. The integrated device of claim 9, wherein the first portion of the second interconnect includes copper.

11. An apparatus comprising:
a substrate;
means for capacitance comprising a first interconnect, a first dielectric layer, and a first portion of a second interconnect, wherein the first dielectric layer is between the first interconnect and the first portion of the second interconnect such that the first interconnect vertically overlaps with the first dielectric layer and the first portion of the second interconnect, wherein the first dielectric layer comprises a first dielectric constant;
means for inductance comprising the first portion of the second interconnect, and a second portion of the second interconnect; and
a second dielectric layer formed over the substrate,
wherein the second dielectric layer comprises a second dielectric constant that is different than the first dielectric constant, and
wherein the second dielectric layer laterally surrounds at least part of the first dielectric layer.

12. The apparatus of claim 11, wherein the means for capacitance comprises an adhesion layer between the first interconnect and the first dielectric layer.

13. The apparatus of claim 12, wherein the adhesion layer comprises titanium.

14. The apparatus of claim 11, wherein the second interconnect comprises a seed layer such that the seed layer is coupled to the first dielectric layer.

15. The apparatus of claim 11, wherein the first interconnect comprises a thickness in a range of about 1-3 micrometers (μm).

16. The apparatus of claim 11, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

17. The apparatus of claim 11, further comprising second means for capacitance, the second means for capacitance comprising:
another first interconnect formed on a same metal layer as the first interconnect;
a first portion of another second interconnect, wherein the other second interconnect is formed on a same metal layer as the second interconnect; and
another first dielectric layer located between the other first interconnect and the first portion of the other second interconnect such that the other first interconnect vertically overlaps with the other first dielectric layer and the first portion of the other second interconnect.

18. The apparatus of claim 11, wherein the first interconnect comprises a thickness in a range of about 1-3 micrometers (µm), the first dielectric layer comprises a thickness in a range of about 0.1-0.4 micrometers (µm), and the first portion of the second interconnect comprises a thickness in a range of about 7-20 micrometers (µm).

19. The apparatus of claim 11, wherein the combination of the means for capacitance and the means for inductance is configured to operate as a means for low pass filtering.

20. A method for fabricating an integrated device, comprising:
providing a substrate;
forming a first interconnect over the substrate;
forming a second interconnect comprising a first portion and a second portion;
providing a first dielectric layer between the first interconnect and the first portion of the second interconnect such that the first interconnect vertically overlaps with the first dielectric layer and the first portion of the second interconnect; and
providing a second dielectric layer over the substrate,
wherein the first interconnect, the first dielectric layer and the first portion of the second interconnect are configured to operate as a capacitor,
wherein the first portion and the second portion of the second interconnect are configured to operate as an inductor,
wherein the first interconnect of the capacitor comprises a thickness in a range of about 1-3 micrometers (µm),
wherein the first dielectric layer of the capacitor comprises a thickness in a range of about 0.1-0.4 micrometers (µm), and
wherein the first portion of the second interconnect of the capacitor comprises a thickness in a range of about 7-20 micrometers (µm).

21. The method of claim 20,
wherein the first dielectric layer comprises a first dielectric constant having a value in a range of about 10-60, and
wherein the second dielectric layer comprises a second dielectric constant having a value in a range of about 1-10.

22. The method of claim 20, further comprising providing an adhesion layer between the first interconnect and the first dielectric layer.

23. The method of claim 22, wherein the adhesion layer comprises titanium.

24. The method of claim 20, wherein forming the second interconnect comprises providing a seed layer such that the seed layer is coupled to the first dielectric layer.

* * * * *